(12) United States Patent
Maruyama

(10) Patent No.: US 6,762,516 B2
(45) Date of Patent: Jul. 13, 2004

(54) ELECTROMAGNETIC ACTUATOR AND EXPOSURE APPARATUS HAVING THE SAME

(75) Inventor: Hiroyuki Maruyama, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/105,327

(22) Filed: Mar. 26, 2002

(65) Prior Publication Data
US 2002/0140298 A1 Oct. 3, 2002

(30) Foreign Application Priority Data
Mar. 29, 2001 (JP) ........................................ 2001-095059

(51) Int. Cl.[7] .............................................. H02K 41/00
(52) U.S. Cl. ............................ 310/12; 355/53; 355/72
(58) Field of Search .............................. 310/12, 13, 14; 355/53, 72

(56) References Cited

U.S. PATENT DOCUMENTS

| | | | | |
|---|---|---|---|---|
| 4,916,340 A | * | 4/1990 | Negishi | 310/12 |
| 5,128,569 A | * | 7/1992 | Gladish | 310/12 |
| 5,864,187 A | * | 1/1999 | Gonzalez | 312/12 |
| 5,933,933 A | * | 8/1999 | Fritz et al. | 29/33 P |
| 6,008,553 A | * | 12/1999 | Gonzalez | 310/12 |
| 6,114,781 A | * | 9/2000 | Hazelton et al. | 310/12 |
| 6,278,203 B1 | * | 8/2001 | Novak et al. | 310/12 |
| 6,300,691 B1 | * | 10/2001 | Hwang et al. | 310/12 |
| 6,313,550 B1 | * | 11/2001 | Binnard et al. | 310/12 |

FOREIGN PATENT DOCUMENTS

JP 10-097966 * 4/1998

* cited by examiner

Primary Examiner—Burton S. Mullins
Assistant Examiner—Judson H. Jones
(74) Attorney, Agent, or Firm—Fitzpatrick, Cella, Harper & Scinto

(57) ABSTRACT

An electromagnetic actuator having stationary and movable elements. The actuator includes a magnet arranged on one of the stationary and movable elements, a coil arranged on the other one of the stationary and movable elements, a first coolant channel formed near the coil, and a second coolant channel formed in or near a surface of at least one of the stationary and movable elements. The first coolant channel and the second coolant channel are formed between the coil and the surface or in the surface.

36 Claims, 12 Drawing Sheets

FIG. 10

| URL | http://www.maintain.co.jp/db/input.html |

TROUBLE DB INPUT WINDOW

OCCURRENCE DATE  2000/3/15 ~404
TYPE OF APPARATUS  **********  ~401
OBJECT  OPERATION ERROR (START-UP ERROR) ~403
DEVICE S/N  465NS4580001 ~402
DEGREE OF URGENCY  D  ~405

SYMPTOM  LED KEEPS FLICKERING AFTER POWER ON ~406

REMEDY  POWER ON AGAIN (PRESS RED BUTTON IN ACTIVATION) ~407

PROGRESS  INTERIM HAS BEEN DONE. ~408

[SEND] [RESET]   410   411   412
LINK TO RESULT LIST DATABASE   SOFTWARE LIBRARY   OPERATION GUIDE

SEMICONDUCTOR DEVICE MANUFACTURING FLOW

ELECTROMAGNETIC ACTUATOR AND EXPOSURE APPARATUS HAVING THE SAME

FIELD OF THE INVENTION

The present invention relates to an electromagnetic actuator such as a linear motor having stationary and movable elements and, more particularly, to an exposure apparatus having the electromagnetic actuator, a device manufacturing method using the exposure apparatus, a device manufacturing factory where the exposure apparatus is installed, and a maintenance method for the exposure apparatus.

BACKGROUND OF THE INVENTION

Typical, conventional exposure apparatuses used for the manufacture of various devices, such as a semiconductor device, are a step and repeat exposure apparatus (also called a stepper) for sequentially exposing a plurality of exposure regions on a substrate with the pattern of a master (reticle or mask) while stepping the substrate (wafer or glass substrate), and a step and scan exposure apparatus (also called a scanner) for repeating step movement and scanning exposure to repetitively expose a plurality of regions on a substrate. In particular, the step and scan exposure apparatus uses only a light component relatively close to the optical axis of a projection optical system by restricting a light beam through a slit. This type of exposure apparatus enables higher-precision exposure of a fine pattern with a larger field angle.

These exposure apparatuses comprise stage devices (wafer stage and reticle stage) for moving a wafer and reticle at high speed and aligning them. A general stage driving method adopts a linear pulse motor (linear motor) using the Lorentz force. The use of the linear motor realizes high-speed driving of the stage movable and stationary portions in non-contact with each other and high-precision alignment.

The stage acceleration along with higher-speed (higher-throughput) alignment processing increases more and more. For example, in the step and scan exposure apparatus, the maximum stage acceleration reaches 5×9.81 m/s² (5G) for the reticle stage and 1×9.81 m/s² (1G) for the wafer stage. The driving force defined by <mass of moving member>× <acceleration> becomes very large. This also increases the heat generation amount of a stage driving linear motor, and generated heat is seriously influencing the surroundings. To suppress heat generated from a coil, a coolant has conventionally been caused to flow near the coil. The coolant flowing method includes a method of cooling only a coil support, as shown in FIGS. 6A and 6B, and a method of cooling the entire coil, as shown in FIGS. 7A and 7B. A linear motor shown in FIGS. 6A and 6B and a linear motor shown in FIGS. 7A and 7B schematically represent a linear motor in which a coil 4 is attached to a stationary element 1 to drive a movable element 2. FIGS. 6A and 7A are plan views, and FIGS. 6B and 7B are sectional views taken along the lines D–D' and E-E', respectively. In FIGS. 6A and 6B, a coolant channel 32 is formed partially inside a coil support 33, which partially supports the coil 4, and only the coil support 33 is cooled. In this method, the coil 4 is exposed at portions other than the portions where the coil 4 is supported by the coil support 33, and heat greatly influences the surroundings. In FIGS. 7A and 7B, a coolant channel 32 is formed entirely inside a coil support 33 which supports a whole coil 4, and the whole coil 4 is cooled. In this method, heat less influences the surroundings, compared to the method of cooling only the coil support, as shown in FIGS. 6A and 6B. However, a relatively large temperature difference is generated between the upstream and downstream of the cooling coolant. The surface temperature of the linear motor cannot be made uniform, and the temperature difference influences the surroundings.

The conventional manufacturing process of a semiconductor element such as a VLSI formed from an ultrafine pattern employs a reduction type projection exposure apparatus for projecting a circuit pattern drawn on a mask onto a substrate coated with a photosensitive agent and printing the pattern. With an increase in the mounting density of a semiconductor element, demand has arisen for further micropatterning, and the exposure apparatus is coping with micropatterning.

To achieve high-speed alignment by using the linear motor capable of high-precision alignment, a large driving force must be generated. For this purpose, a large current must be caused to flow through the coil. Causing a large current to flow further increases the heat generation amount of the coil.

In general, a semiconductor exposure apparatus uses an interferometer for high-precision alignment. However, heat generated from a coil increases and fluctuates the temperature near a linear motor or in a stage space where the optical axis of the interferometer and a mirror are installed. This decreases the measurement precision of the interferometer.

SUMMARY OF THE INVENTION

It is an object of the present invention to provide an electromagnetic actuator such as a linear motor capable of suppressing the influence of heat generated from a coil in an external space.

It is another object of the present invention to provide an exposure apparatus capable of increasing the alignment speed in exposure, increasing the throughput, performing high-speed alignment, and exposing a fine pattern, a device manufacturing method using the exposure apparatus, a semiconductor manufacturing factory including the exposure apparatus, and a maintenance method for the exposure apparatus.

The present invention provides the following electromagnetic actuator. This electromagnetic actuator is an electromagnetic actuator having stationary and movable elements, comprising a magnet arranged on one of the stationary and movable elements, a coil arranged on the other one of the stationary and movable elements, a first coolant channel formed near the coil, and a second coolant channel formed in or near a surface of at least one of the stationary and movable elements. The present invention may be applied to a movable magnet type electromagnetic actuator, a movable coil type electromagnetic actuator, or another type of electromagnetic actuator.

According to a preferred aspect of the present invention, the first coolant channel is essentially formed to cool the coil, and the second coolant channel is essentially formed to adjust a surface temperature of the electromagnetic actuator.

According to another preferred aspect of the present invention, the electromagnetic actuator preferably further comprises a support which internally supports the coil, the first coolant channel is preferably formed inside the support, and the second coolant channel is preferably formed between the first coolant channel and a surface of the support or in the surface of the support. This electromagnetic actuator is suitable for an electromagnetic actuator in which the stationary element has the coil and the movable element has the magnet.

According to still another aspect of the present invention, the electromagnetic actuator may further comprise a support which supports the magnet, the support may be arranged outside the coil and the first coolant channel so as not to contact the coil and the first coolant channel, and the second coolant channel may be formed between the first coolant channel and a surface of the support or in the surface of the support. This electromagnetic actuator is also suited to an electromagnetic actuator in which the stationary element has the coil and the movable element has the magnet. The first coolant channel is preferably so formed as to surround the coil.

According to still another aspect of the present invention, the electromagnetic actuator preferably further comprises a temperature detector for detecting at least one of a temperature of a coolant flowing through the first coolant channel and a temperature of a coolant flowing through the second coolant channel, a thermo-regulator for adjusting temperatures of coolants supplied to the first and second coolant channels, and a temperature controller for controlling the thermo-regulator on the basis of a detection result of the temperature detector.

Alternatively, the electromagnetic actuator preferably further comprises a temperature detector for detecting a temperature of a surface of the electromagnetic actuator or a temperature near the surface, a thermo-regulator for adjusting temperatures of coolants supplied to the first and second coolant channels, and a temperature controller for controlling the thermo-regulator on the basis of a detection result of the temperature detector. The temperature detector preferably detects a temperature of a coolant flowing through the second coolant channel in addition to the temperature of the surface of the electromagnetic actuator or the temperature near the surface.

According to still another aspect of the present invention, the electromagnetic actuator preferably further comprises a heat insulator arranged outside the second coolant channel or between the first and second coolant channels.

According to still another aspect of the present invention, the first and second coolant channels preferably flow coolants in opposite directions. Alternatively, a plurality of second coolant channels are also preferably formed parallel to each other, and flowing directions of coolants through the plurality of second coolant channels are preferably made opposite to each other every predetermined number of channels. Alternatively, the second coolant channel is also preferably meandered.

The present invention provides an exposure apparatus in which the above electromagnetic actuator is applied to a stage for moving a substrate or master. This exposure apparatus comprises a laser interferometer for measuring a position of the stage, and the second coolant channel can be formed between an optical axis of the laser interferometer and the coil.

The present invention provides a device manufacturing method, comprising the steps of installing manufacturing apparatuses for performing various processes including the above exposure apparatus in a device manufacturing factory, and manufacturing a device by performing a plurality of processes using the manufacturing apparatuses.

According to still another aspect of the present invention, the device manufacturing method preferably further comprises the steps of connecting the manufacturing apparatuses by a local area network, and communicating information about at least one of the manufacturing apparatuses between the local area network and an external network outside the device manufacturing factory. The method preferably further comprises the step of accessing a database provided by a vendor or user of the exposure apparatus via the external network to obtain maintenance information about at least one of the manufacturing apparatuses by data communication. The method preferably further comprises the step of performing data communication between the device manufacturing factory and another device manufacturing factory via the external network to perform production management.

The present invention provides a device manufacturing factory comprising manufacturing apparatuses for performing various processes including the above exposure apparatus, a local area network for connecting the manufacturing apparatuses, and a gateway which enables access from the local area network to an external network outside the factory, wherein information about at least one of the manufacturing apparatuses can be communicated.

The present invention provides a maintenance method for the above exposure apparatus that is installed in a device manufacturing factory, comprising the steps of causing a vendor or user of the exposure apparatus to provide a maintenance database connected to an external network outside the device manufacturing factory, permitting access to the maintenance database from the device manufacturing factory via the external network, and transmitting maintenance information accumulated in the maintenance database to the device manufacturing factory via the external network.

The exposure apparatus preferably further comprises a display, a network interface, and a computer for executing network software, and maintenance information of the exposure apparatus can be communicated via a computer network. The network software preferably enables connecting the computer to the external network outside the factory where the exposure apparatus is installed, providing on the display a user interface for accessing a maintenance database which is provided by a vendor or user of the exposure apparatus, and obtaining information from the database via the external network.

According to the preferred aspects of the present invention, most of the heat from the coil is recovered by the first coolant flowing through a coil cooling coolant channel (first coolant channel). The remaining heat which cannot be recovered by the first coolant is recovered by the second coolant flowing through a temperature adjustment coolant channel (second coolant channel). The overall electromagnetic actuator such as a linear motor can be efficiently cooled. Heat recovery by the second coolant is much smaller than that by the first coolant. The temperature distribution between the upstream and downstream of the coolant can be substantially ignored on the surface of the electromagnetic actuator. The influence of heat in the vicinity of the electromagnetic actuator, particularly the stage space of the exposure apparatus, can be suppressed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a view showing an example of a user interface;

DETAILED DESCRIPTION OF THE PREFERRED EMBODIMENTS

Figure 1A:
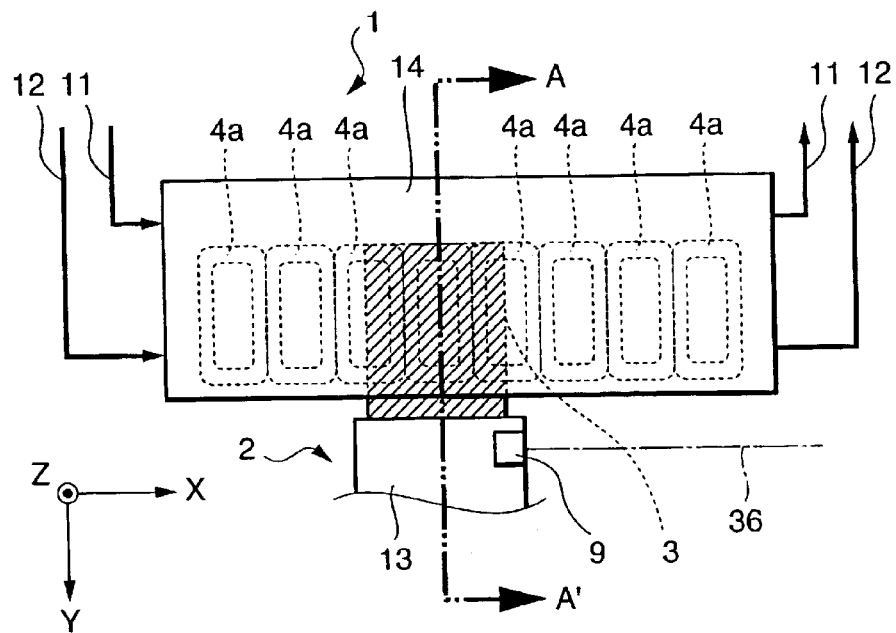
FIGS. 1A and 1B are a plan view and sectional view, respectively, showing an embodiment of a two-layered linear motor according to the present invention.

Preferred embodiments of the present invention will be described below.

In an electromagnetic actuator according to preferred embodiments of the present invention, a temperature adjustment coolant channel is at least partially formed inside a stationary element, in its surface, inside a movable element, or in its surface. According to the preferred embodiments of the present invention, a local heat generating portion or a portion which must be cooled due to the shape of the electromagnetic actuator or the like can be efficiently cooled by forming the temperature adjustment coolant channel at the target portion. This enables mainly cooling the vicinity of a device seriously influenced by heat, cooling a local heat generating portion, or making the temperature of the overall electromagnetic actuator uniform. In general, the temperature adjustment coolant channel is formed between a coil cooling coolant channel and the surface of the electromagnetic actuator or in the surface of the electromagnetic actuator in order to adjust the surface temperature to a predetermined temperature. In a linear motor in which a coil as a heat generating portion is arranged on the stationary element side, the temperature adjustment coolant channel is preferably formed in or near the surface of the stationary element because of the following reason. The surface area of the stationary element of the linear motor is generally larger than that of the movable element, and the surface of the stationary element is exposed. The surface of the stationary element influences the surroundings more than the surface of the movable element in the overall electromagnetic actuator. This trend becomes prominent in an electromagnetic actuator constituted to sandwich a movable element between facing guide surfaces of two stationary elements. When the stationary and movable elements are not so different in size in, e.g., an electromagnetic actuator for slightly adjusting the posture of a stage or the like, the position of the coolant channel is determined in accordance with the shapes of the stationary and movable elements. For example, the temperature adjustment coolant channel is preferably formed near the surface of the movable element when the guide surface is formed from the outer side surface of the stationary element and the movable element surrounds the whole stationary element in an electromagnetic actuator in which a coil serving as a heat generating member is arranged on the stationary side.

An electromagnetic actuator according to preferred embodiments of the present invention comprises a temperature detector for measuring either one or both of the temperature of a coolant (first coolant) flowing through a coil cooling coolant channel and the temperature of a coolant (second coolant) flowing through a temperature adjustment coolant channel, and a temperature controller for controlling the coolant temperature. This temperature detector comprises a plurality of temperature sensors when the temperature is measured at a plurality of portions. The coolant temperature may be detected based on measurement results obtained by measuring the temperature of an inlet or outlet with respect to the electromagnetic actuator. Alternatively, the coolant temperature of a coolant flowing through the inside of the electromagnetic actuator may be directly measured. Alternatively, the coolant temperature may be detected based on a plurality of measurement results obtained by measuring the temperatures at a plurality of internal positions. The coolant temperature is adjusted by cooling the coolant by a thermo-regulator.

The temperature controller generally adjusts the coolant temperature by controlling the thermo-regulator. In this case, the internal or surface temperature of the electromagnetic actuator is preferably measured to control the thermo-regulator by the temperature controller in consideration of the measurement result. The surface temperature of the electromagnetic actuator can be adjusted to a predetermined temperature.

A heat insulator is preferably arranged at least partially in or on the electromagnetic actuator. This heat insulator can suppress external heat dissipation and can further suppress the influence of heat on a stage-installed space or near the electromagnetic actuator on measurement of the stage position or the like.

An exposure apparatus according to preferred embodiments of the present invention comprises a laser interferometer for measuring the position of a stage or movable element. The laser interferometer is generally constituted by a position measurement mirror attached to the movable element, and a beam irradiator and beam receiver arranged on the stationary element or an exposure apparatus main body where the stationary element is set. The beam irradiator emits a measurement beam to the position measurement mirror. The beam receiver receives the beam reflected by the position measurement mirror. To accurately measure the position of the stage or movable element, a temperature adjustment coolant channel is preferably arranged near the laser beam optical path of a laser interferometer. A beam emitted by the laser interferometer and a beam reflected by the position measurement mirror generally orient parallel to the moving direction of the movable element. Thus, the temperature adjustment coolant channel is more preferably so arranged as to flow the second coolant along the guide surface of the stationary element.

The exposure apparatus according to preferred embodiments of the present invention comprises a display, a network interface, and a computer for executing network software so as to communicate data such as maintenance information of the exposure apparatus via a computer network. The network software provides on the display a user interface for accessing a maintenance database which is provided by the vendor or user of the exposure apparatus and connected to an external network outside a factory where the exposure apparatus is installed. The network software permits obtaining information from the database via the external network.

A device manufacturing method according to preferred embodiments of the present invention comprises the steps of installing manufacturing apparatuses for performing various processes including a plurality of types of exposure apparatuses in a semiconductor manufacturing factory, and manufacturing a semiconductor device by performing a plurality of processes using the manufacturing apparatuses.

The device manufacturing method may further comprise the steps of connecting the manufacturing apparatuses by a local area network, and communicating information about at least one of the manufacturing apparatuses between the local area network and an external network outside the semiconductor manufacturing factory.

Moreover, a database provided by the vendor or user of the exposure apparatus may be accessed via the external network to obtain maintenance information of the manufacturing apparatus by data communication, or data communication may be performed between the semiconductor manufacturing factory and another semiconductor manufacturing factory via the external network to perform production management.

Embodiments of the present invention will be described below with reference to the accompanying drawings.

<First Embodiment>

Figure 1B:
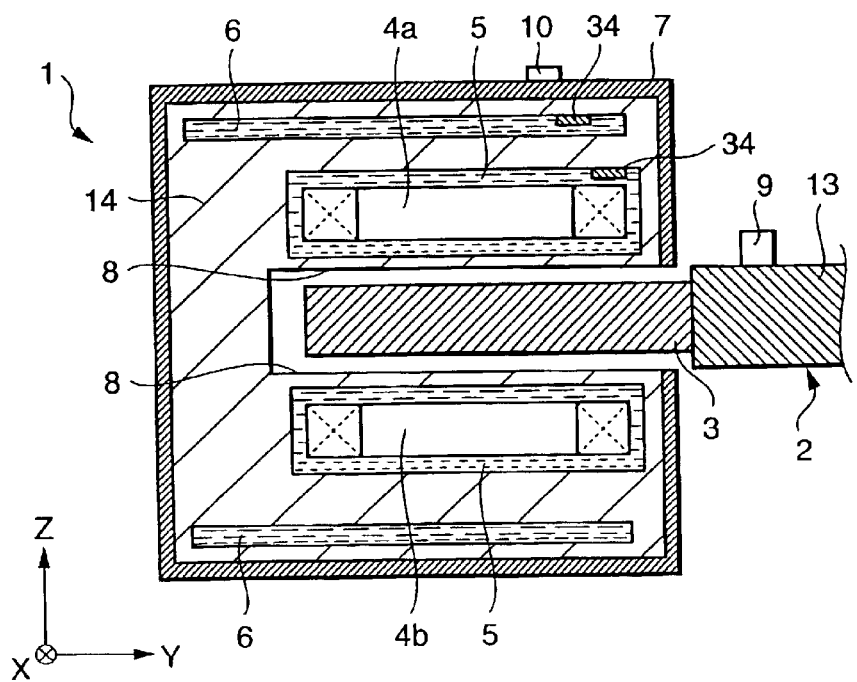

FIG. 1A is a plan view showing a linear motor (electromagnetic actuator) in which a two-layered coil is arranged according to the first embodiment of the present invention. FIG. 1B is a sectional view taken along the line A-A'.

In FIGS. 1A and 1B, a stationary element 1 has guide surfaces 8. A movable element 2 having a magnet 3 attached to a Y guide bar 13 can move in the X direction along the guide surfaces 8. The movable element 2 has an X-axis position measurement mirror 9 for measuring the X-axis position of the movable element 2. The stationary element 1 incorporates two coil arrays such that their outer surfaces face each other. One coil array is constituted by aligning a plurality of coils 4a wound with a conductor in the X direction. The other coil array is similarly constituted by aligning a plurality of coils 4b wound with a conductor in the X direction.

In this linear motor, one of two side surfaces (upper and lower surfaces) of each coil 4a in contact with outer and inner surfaces at right angles faces one side surface of the coil 4b. The two coil arrays are supported by the stationary element 1 at a distance along the Z-axis (vertically). The two coil arrays are incorporated in the stationary element 1 so as to sandwich the magnet 3 between their facing coil surfaces from above and below the magnet 3 in a non-contact manner. The guide surfaces 8 are formed between the respective coil arrays and the magnet 3. The stationary element 1 includes these coil arrays, and a support 14, which supports a member having the guide surfaces 8. As shown in FIG. 1B, which is a sectional view of the linear motor taken along the Y-Z plane, first coolant channels 5 serving as coil cooling coolant channels are formed around the coils 4a and 4b. A coolant from a first coolant pipe 11 flows along each coil array in the X direction. Each first coolant channel 5 surrounds a corresponding coil array, and the coolant is distributed to almost the entire surface of the coils 4. Hence, most of the heat generated from the coils 4 can be recovered.

Two second coolant channels 6 serving as temperature adjustment coolant channels are formed near the surface of the stationary element 1. The two second coolant channels 6 are formed near the upper and lower surfaces of the linear motor building member 14 within the member 14 such that the second coolant channels 6 exist in almost the entire upper and lower surfaces (opposite to the side on which the two coil arrays face each other) of the stationary element 1. The sectional shape of each second coolant channel 6 is a rectangle long along the Y-axis and short along the Z-axis. The surface temperature of the stationary element 1 is adjusted by a coolant flowing through a second coolant pipe 12. The surface temperature of the linear motor is detected by a temperature sensor 10 disposed on the upper surface of the stationary element 1. The temperatures of the first and second coolants are detected by measuring the inlet or outlet temperatures of the first and second coolants by temperature sensors 35 shown in FIG. 5. A temperature controller 31 controls a thermo-regulator 30 on the basis of the detection results of the temperature sensors 10 and 35. In this way, the coolant temperatures are adjusted to keep the surface temperature of the stationary element 1 at a predetermined one.

Figure 5:
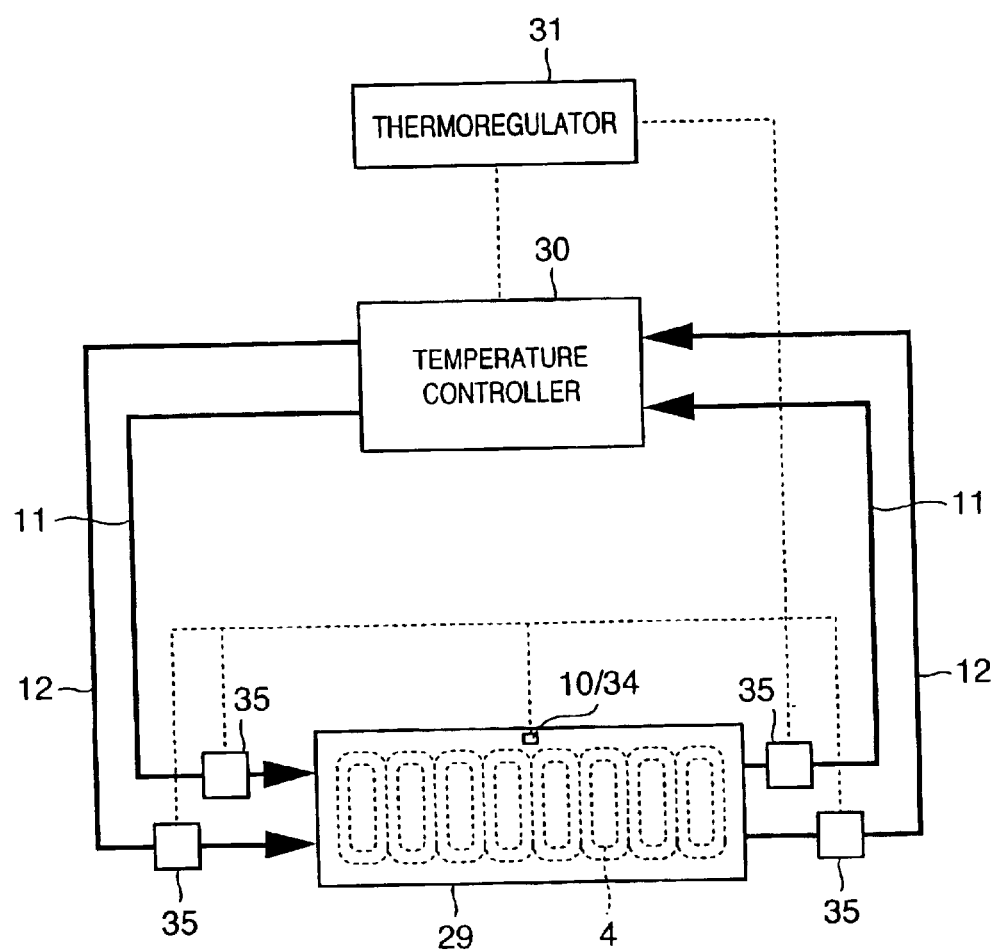
FIG. 5 is a block diagram showing the temperature control system of the linear motor according to the embodiment of the present invention.
Figure 6A:
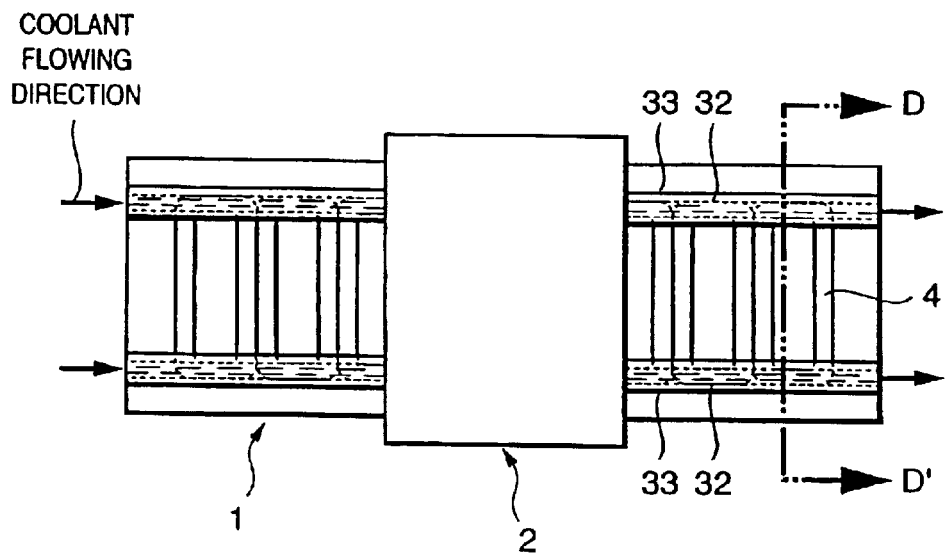
FIGS. 6A and 6B are views showing a conventional linear motor cooling method.
Figure 6B:
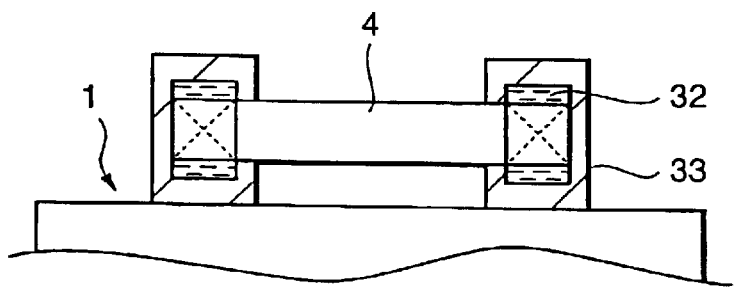
Figure 7A:
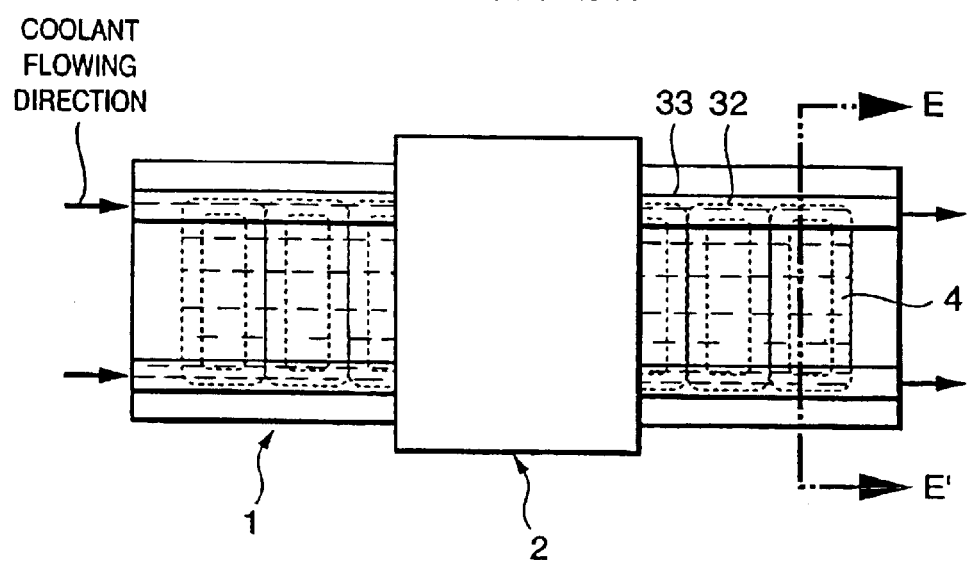
FIGS. 7A and 7B are views showing another conventional linear motor cooling method.
Figure 7B:
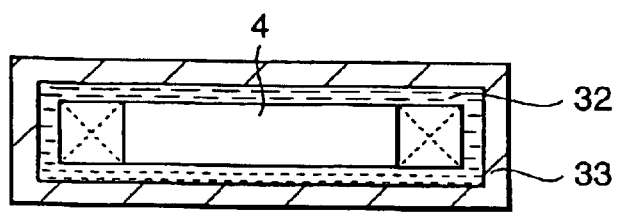

More specifically, in FIG. 5, the temperature controller 31 is connected to the temperature sensors 35 and the temperature sensor 10 of a linear motor 29. The temperature controller 31 transmits to the thermo-regulator 30 a control signal for controlling the coolant temperatures (measurement values of the temperature sensors 35) in consideration of the surface temperature as the measurement value of the temperature sensor 10. The thermo-regulator 30 adjusts the first and second coolants to proper temperatures in accordance with the control signal. The coolant temperatures may be detected using temperature sensors 34 (FIG. 1B) arranged inside respective coolant channels, instead of measuring the coolant temperature at the inlet to the linear motor and that at the outlet from the linear motor.

In the first embodiment, a heat insulator 7 is so arranged as to cover the entire surface of the stationary element 1 except for the guide surfaces 8. The heat insulator 7 cuts off or reduces heat externally dissipating from the stationary element 1. In this manner, the heat insulator 7 is arranged on the surface of the stationary element 1, and the temperature sensor 10 disposed on the surface of the stationary element 1 detects the surface temperature. The temperature sensors 35 shown in FIG. 5 measure the inlet or outlet temperatures of the first and second coolants to detect the temperatures of the first and second coolants. The thermo-regulator 30 and temperature controller 31 control the coolant temperatures in consideration of the detected surface temperature. This arrangement enables accurately keeping the surface of the stationary element 1 at an arbitrary temperature. The heat insulator may be arranged on the entire surface or high-temperature portion of the stationary or movable element or at a portion near the optical axis of an interferometer. A plurality of second coolant channels 6 may be formed inside the stationary element 1, in part of its surface, or in its entire surface. If a plurality of second coolant channels 6 are formed to individually adjust the flow rates, flowing directions, or temperatures of coolants, even local heat generated from the stationary element 1 can be removed from a desired portion. The temperature distribution on the surface of the stationary element 1 can be kept uniform.

The flow direction of the coolant is preferably taken into consideration. For example, when only one second coolant channel 6 is formed, the first and second coolant channels 5 and 6 are preferably laid out such that the flow direction of a coolant flowing through the second coolant channel 6 is opposite to that of a coolant flowing through the first coolant channel 5. When a plurality of channels are to be formed, the flow directions of coolants flowing through adjacent coolant channels are made parallel in opposite directions (or opposite directions for every plurality of channels). This can also make the temperature distribution of the surface temperature uniform. If the number of pipes to the linear motor is restricted, one pipe is folded several times such that the pipe reciprocates inside the stationary element 1, which incorporates the second coolant channel 6, in the surface of the stationary element 1, inside the movable element 2, or in its surface. This layout can cancel the high- and low-temperature portions of a coolant and make the temperature distribution of the surface uniform. The pipe may be concentratedly folded at the high-temperature portion of the linear motor in order to increase the heat recovery amount.

The average surface temperature of the linear motor under given experimental conditions at an ambient temperature of, e.g., 24° C. is 28° C. when only the first coolant channel 5 is laid out, 24.5° C. when the first and second coolant channels 5 and 6 are laid out, and 24.1° C. when the first and second coolant channels 5 and 6 are laid out and the surface is covered with a heat insulator.

<Second Embodiment>

Figure 2A:
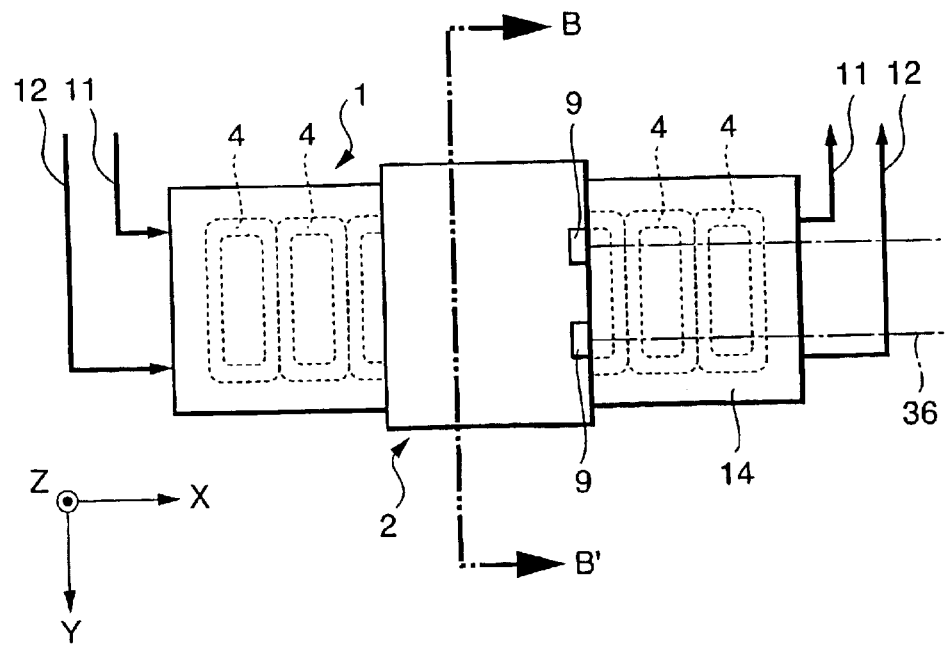
FIGS. 2A and 2B are a plan view and sectional view, respectively, showing an embodiment of a single-layered linear motor according to the present invention.
Figure 2B:
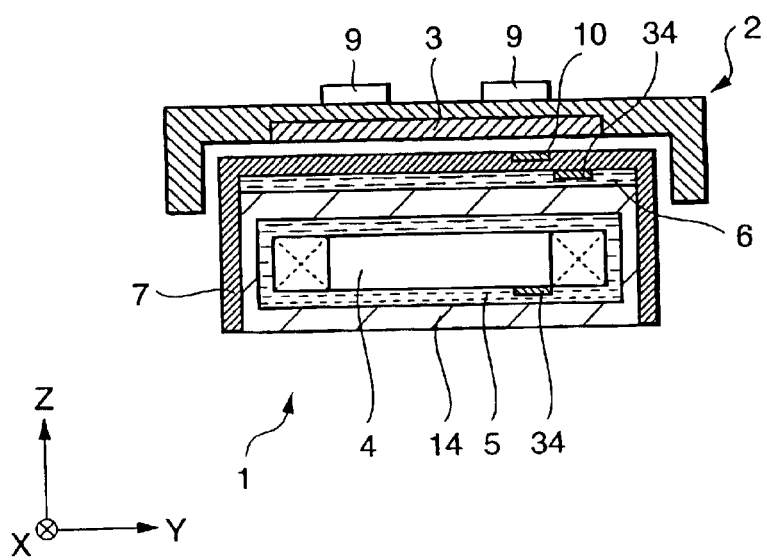

FIG. 2A is a plan view showing a linear motor (electromagnetic actuator) in which a single-layered coil is arranged according to the second embodiment of the present invention. FIG. 2B is a sectional view taken along the line B-B'. In the second embodiment, a stationary element 1 incorporates only a single-layered coil array obtained by aligning a plurality of coils 4 along the X-axis, similar to the first embodiment.

In FIGS. 2A and 2B, one side surface of each coil 4 is so arranged as to face a magnet 3 of a movable element 2 along the Z-axis. The movable element 2 having the magnet 3 and an X-axis measurement mirror 9 can move along the stationary element 1 in the X direction. Guide surfaces are formed from the upper surface (surface facing the magnet 3, i.e., X-Y plane) of the stationary element 1 and part of its two side surfaces (X-Z plane) in the longitudinal direction (X-axis direction) adjacent to the upper surface at right angles. The X position of the movable element 2 is measured by an interferometer (not shown). The interferometer emits a beam 36, and receives the beam 36 reflected by the mirror 9 to measure the X position of the movable element 2.

As shown in FIG. 2B, which is a sectional view taken along a plane (Y-Z plane) perpendicular to the alignment direction (X-axis direction) of the coil 4, a first coolant channel 5 is formed around the coils 4. A coolant from a first coolant pipe 11 flows along the coil array in the X direction to recover most of the heat generated from the coils 4. A heat insulator 7 is arranged on the upper surface (surface facing the movable element 2) and the X-Z plane of the stationary element 1 so as to cover the entire surface. The heat insulator 7 cuts off or reduces externally dissipating heat. The stationary element 1 has a second coolant channel 6 between the heat insulator 7 and a linear motor building member 14 over almost the entire upper surface of the stationary element 1. A temperature sensor 10 detects the surface temperature of the stationary element 1. Temperature sensors 35 shown in FIG. 5 measure the inlet or outlet temperatures of the first and second coolants. A temperature controller 31 controls a thermo-regulator 30 in consideration of the surface temperature detected by the temperature sensor 10 to adjust the coolant temperatures. Under this control, the surface temperature of the stationary element 1 is kept at a predetermined one. The coolant temperatures may be detected using temperature sensors 34 arranged inside the respective coolant channels shown in FIG. 2B.

A plurality of second coolant channels 6 may be formed inside the stationary element 1, in part of its surface, or in its entire surface. If a plurality of second coolant channels are formed to individually adjust the flow rates, flowing directions, or temperatures of coolants, even local heat generated from the stationary element 1 can be removed from a desired portion. The temperature distribution on the surface of the stationary element 1 can be kept uniform.

The second embodiment can suppress, e.g., fluctuations of the beam 36 from the alignment interferometer that passes immediately above the stationary element.

<Third Embodiment>

Figure 3A:
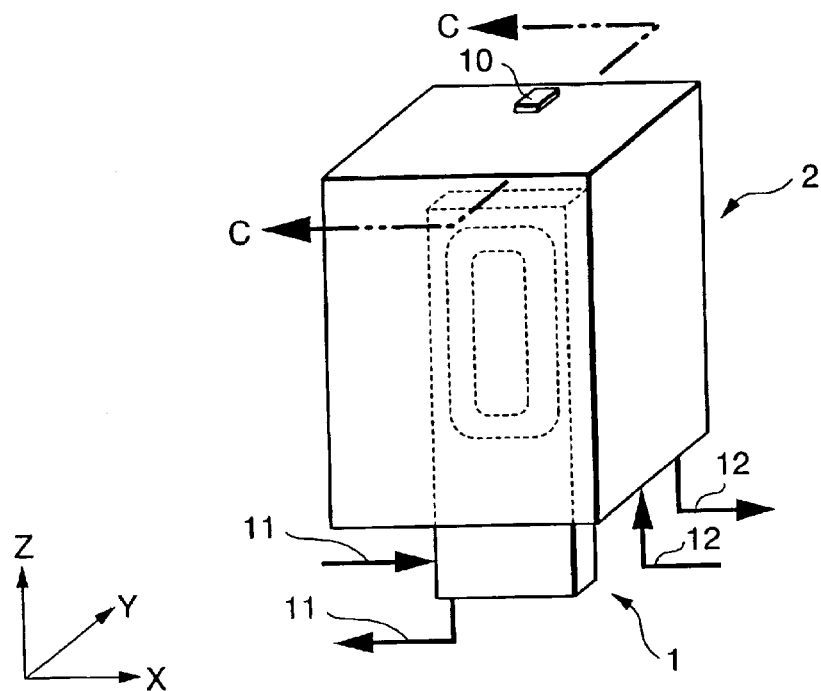
FIGS. 3A and 3B are a perspective view and sectional view, respectively, showing an embodiment of a single-coil linear motor according to the present invention.
Figure 3B:
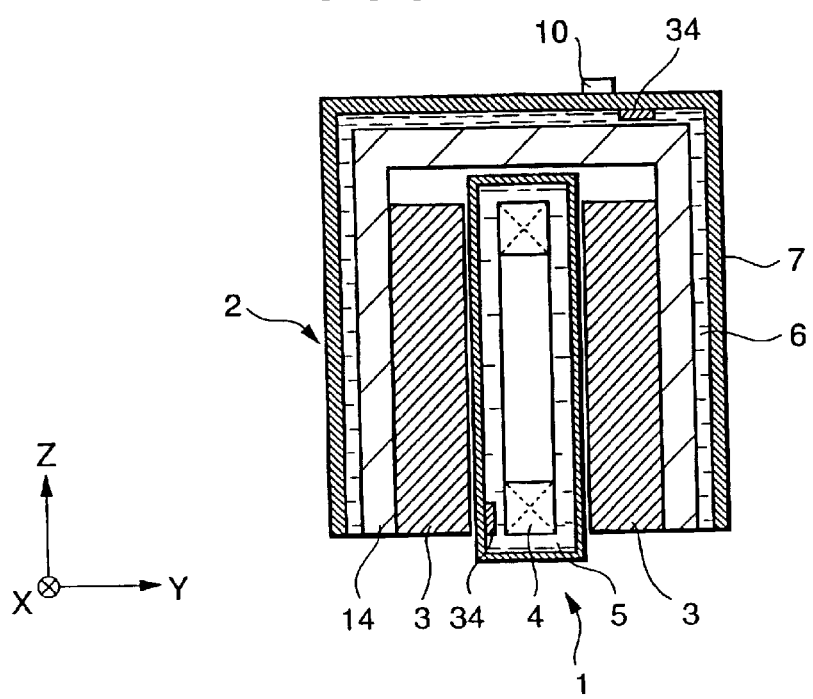

FIG. 3A is a perspective view showing a linear motor realized by a single coil according to the third embodiment of the present invention. FIG. 3B is a sectional view taken along the line C-C'.

In FIGS. 3A and 3B, a stationary element 1 has a coil 4, and a first coolant channel 5 so formed as to surround the coil 4. A movable element 2 is so arranged as to surround the stationary element 1 from above it. The stationary and movable elements 1 and 2 generate driving forces by the Lorentz force. The movable element 2 finely moves vertically (Z-axis direction) along guide surfaces formed from the entire side surfaces of the stationary element 1 except for the upper and lower surfaces.

The movable element 2 has a pair of plate-like magnets 3 laid out parallel to each other so as to sandwich the coil 4 from its two side surfaces. Each magnet 3 is supported by a support 14 inside the movable element 2. The surfaces of the movable element 2 except for the lower surface are covered with a heat insulator 7. The heat insulator 7 cuts off or reduces externally dissipating heat. A second coolant channel 6 is formed between the heat insulator 7 and the support 14 over almost the entire surface. A temperature sensor 10 disposed on the upper surface of the movable element 2 detects the surface temperature. Temperature sensors 35 shown in FIG. 5 measure the inlet or outlet temperatures of the first and second coolants to detect the temperatures of the first and second coolants. A temperature controller 31 controls a thermo-regulator 30 in consideration of the surface temperature detected by the temperature sensor 10 to adjust the coolant temperatures. Under this control, the surface temperature of the movable element 2 is kept at a predetermined one. The coolant temperatures may be detected using temperature sensors 34 arranged inside the respective coolant channels shown in FIG. 3B. A plurality of second coolant channels 6 may be formed inside the movable element 2, in part of its surface, or in its entire surface.

In the third embodiment, the coil-attached side may be a movable element, and the magnet-attached side may be a stationary element.

<Fourth Embodiment>

Figure 4A:
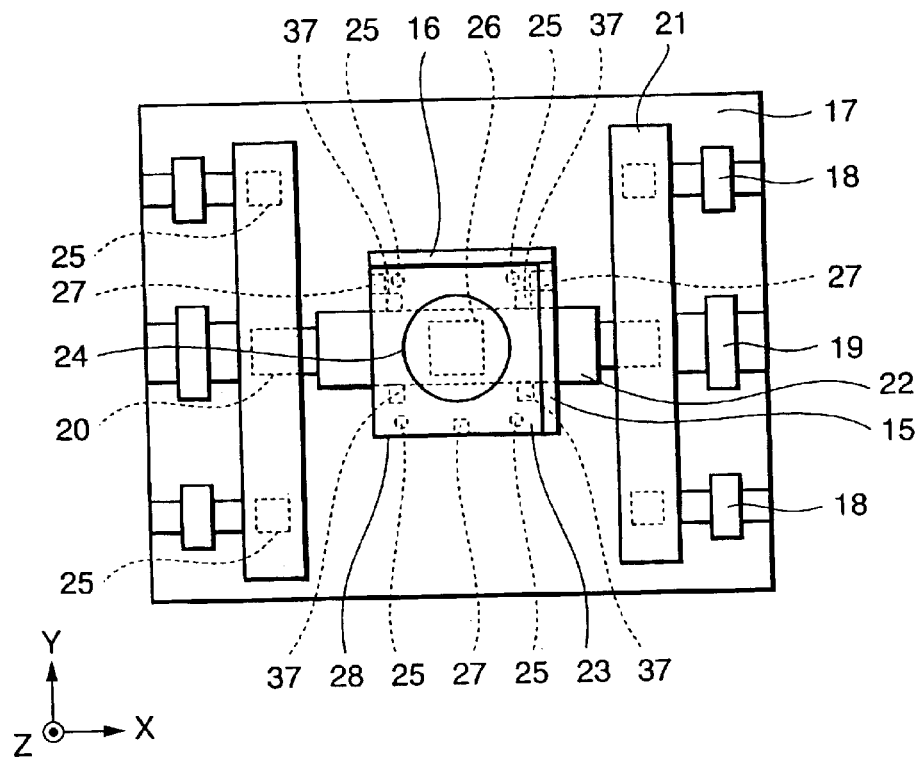
FIGS. 4A and 4B are views showing an embodiment of an exposure apparatus according to the present invention.
Figure 4B:
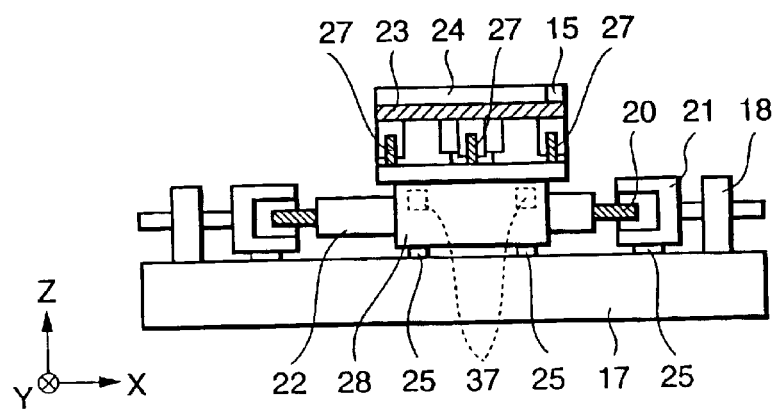

An embodiment of an exposure apparatus in which the linear motor of the above-described embodiments is applied to a fine moving stage (six-axis movable stage) that supports θ- and Z-axis tilt stages will be described with reference to FIGS. 4A and 4B. FIG. 4A is a plan view showing the stage of the exposure apparatus of this embodiment when viewed from above (Z-axis direction). FIG. 4B is a view showing the stage when viewed from the side (Y-axis direction).

In FIGS. 4A and 4B, a wafer chuck 24 and position measurement bar mirrors 15 and 16 are arranged on a top plate 23. The wafer chuck 24 vacuum-chucks and holds a wafer serving as an object to be aligned. The bar mirrors 15 and 16 reflect a measurement beam from a laser interferometer (not shown). The laser interferometer (not shown) measures the position of the top plate 23 on the basis of the beam reflected by the bar mirrors 15 and 16. Fine moving linear motors (X/Y-axis linear motors 26 and Z-axis linear motors 27) serving as electromagnetic actuators for generating a driving force are interposed between the top plate 23 and an X slider 28. The top plate 23 is finely driven by the electromagnetic actuators along six axes (X, Y, and Z directions and their rotational directions) with respect to the X slider 28. That is, the top plate 23 can be translated along the X-axis by the fine moving X-axis linear motor 26. The top plate 23 can be translated along the Y-axis by the fine moving Y/X-axis linear motor 26. By driving the two fine moving X-axis linear motors 26 (or two fine moving Y-axis linear motors 26) in opposite directions, the top plate 23 can be driven along the Z-axis ($\theta$ direction). By adjusting the driving forces of the three fine moving Z-axis linear motors 27, the top plate 23 can be driven in the Z-axis translation direction, about the X-axis ($\omega$X direction), and about the Y-axis ($\omega$Y direction). A coil serving as a stationary element 1 of the fine moving linear motor is arranged on the X slider 28. A magnet serving as a movable element 2 of the fine moving linear motor is arranged on the top plate 23 side.

The electromagnetic actuator of the fourth embodiment can control the surface temperature of the fine moving linear motor to a predetermined one, as described in the third embodiment. The influence of heat on a stage space around the fine moving linear motor or the like can be suppressed.

The X slider 28 is guided by an X-axis linear motor 22 via air bearings (static pressure bearings) 37. In other words, the X slider 28 is supported movably along the X-axis by the X-axis linear motor 22 via the air bearings 37. When the X-axis linear motor 22 moves along the Y-axis, the X slider 28 receives a Y-axis driving force via the air bearings 37. Along the Z-axis, the X slider 28 is guided by a reference structure 17 via air bearings (static pressure bearings) 25. Y-axis linear motor movable elements (magnets) 20 are attached near the two ends of the X-axis linear motor 22.

The Y-axis linear motor movable elements 20 generate a Lorentz force by flowing a current through two Y-axis linear motor stationary elements (coils) 21. When the Y-axis linear motor generates a Y-axis force, this force drives along the Y-axis the X-axis linear motor 22, the X slider 28, and a fine moving portion on the X slider 28 (these building components which move along the Y-axis will be called the "X-axis linear motor 22 and the like" hereinafter).

The two Y-axis linear motor stationary elements (coils) 21 are guided in the Z direction on the upper surface of the reference structure 17 by the air bearings (static pressure bearings) 25. The Y-axis linear motor stationary elements 21 have the degree of freedom in the X and Y directions (two-dimensional directions). When the Y-axis linear motor generates a Y-axis force, the Y-axis linear motor stationary elements (coils) 21 move in a direction opposite to the X-axis linear motor 22 and the like. The Y-axis linear motor stationary elements 21 move in the direction opposite to the X-axis linear motor 22 and the like by a driving reaction force generated upon driving the X-axis linear motor 22 and the like along the Y-axis. Thus, the driving reaction force can be canceled. No influence occurs upon changes in the centers of gravity of the Y-axis linear motor stationary elements 21 and the X-axis linear motor 22 and the like. Similarly, the Y-axis linear motor stationary elements 21 are also movable along the X-axis, so that an X-axis driving reaction force can be canceled.

Linear motors (Y-axis) 18 for controlling the position of a linear motor stationary element, and a linear motor (X-axis) 19 for controlling the position of a linear motor stationary element are arranged for the Y-axis linear motor stationary elements (coils) 21 in order to maintain the relationship with the reference structure 17. The linear motors 18 and 19 prevent the Y-axis linear motor stationary elements 21 having degrees of freedom in the X and Y directions from deviating from a predetermined moving range.

Linear motors having the same structures as those in the first and second embodiments are applied to the Y-axis linear motor stationary elements 21 and X-axis linear motor 22 in the fourth embodiment.

According to the fourth embodiment, a laser beam (not shown) for a laser interferometer that irradiates the X-axis position measurement bar mirror 15 passes immediately above the Y-axis linear motor stationary elements (coils) 21 and X-axis linear motor 22. By flowing currents through the stationary elements (coils), the X- and Y-axis linear motors generate Lorentz forces to obtain driving forces. To obtain a large driving force, a large current must be caused to flow through the coil, which generates a large amount of heat. In the prior art, this causes spatial fluctuations in the optical path of a laser beam for the laser interferometer fluctuations, decreasing the measurement precision of the interferometer. To the contrary, according to the linear motor of the fourth embodiment, heat from the coil is reduced by the first coolant, similar to those described in the first and second embodiments. Further, the heat insulator is arranged on the surface of the stationary element to cut off or reduce dissipation of heat. The surface temperature of the stationary element is managed by the second coolant to greatly suppress spatial fluctuations.

By cutting off or reducing heat to the outside of the linear motor, heated air, which is generated by the X-axis linear motor 22 and X slider 28 moving on the reference structure 17 and flows through the space, is prevented from entering the optical path of a laser beam for the laser interferometer and decreasing the measurement precision of the interferometer owing to spatial fluctuations. Even if the stage acceleration increases, the influence of heat on the stage space can be suppressed, and the throughput can also be increased.

In the fourth embodiment, the present invention is applied to a substrate stage. The present invention can also be applied to a master stage. In order not to make the features of the present invention unnecessarily ambiguous, an illumination optical system, master stage, projection optical system, various measurement devices, and the like have not been described. These building components can be assembled into the exposure apparatus by a known technique.

<Embodiment of A Semiconductor Production System>

A production system for producing a semiconductor device (e.g., a semiconductor chip such as an IC or LSI, a liquid crystal panel, a CCD, a thin-film magnetic head, a micromachine, or the like) will be exemplified. A trouble remedy or periodic maintenance of a manufacturing apparatus installed in a semiconductor manufacturing factory, or maintenance services such as software distribution is performed by using a computer network outside the manufacturing factory.

Figure 8:
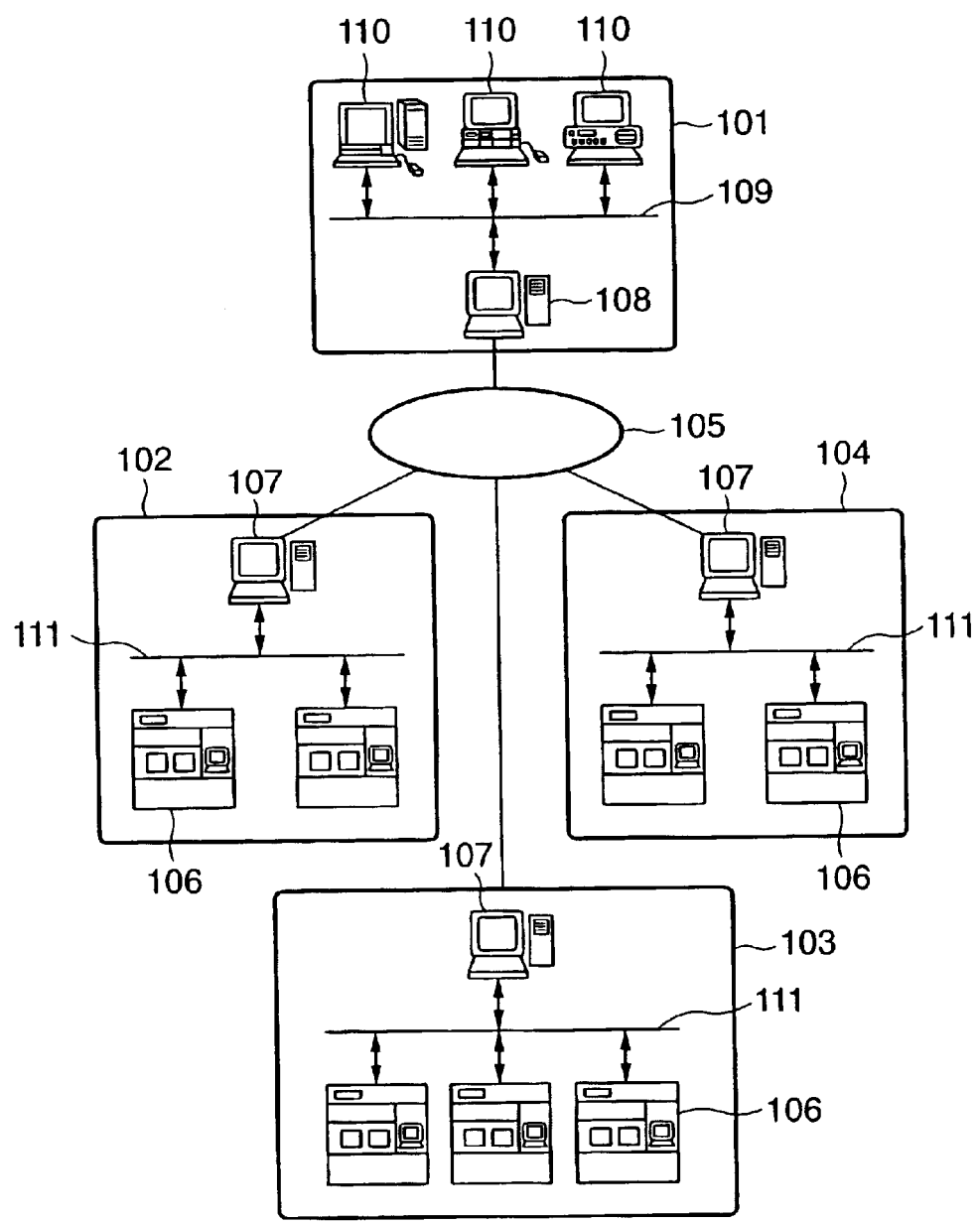
FIG. 8 is a view showing the concept of a semiconductor device production system when viewed from a given angle.

FIG. 8 shows the overall system cut out at a given angle. In FIG. 8, reference numeral 101 denotes a business office of a vendor (e.g., an apparatus supply manufacturer), which provides a semiconductor device manufacturing apparatus.

Examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to build an intranet. The host management system 108 has a gateway for connecting the LAN 109 to Internet 105 serving as an external network outside the business office, and a security function for limiting external access.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 serving as an external network outside the factory. Each factory can access the host management system 108 of the vendor 101 from the LAN 111 via the Internet 105. The security function of the host management system 108 authorizes access of only a limited number of users. More specifically, the factory notifies the vendor via the Internet 105 of status information (e.g., the symptom of a manufacturing apparatus in trouble) representing the operation status of each manufacturing apparatus 106, and receives response information (e.g., information designating a remedy against trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network outside the factory, a high-security dedicated network (e.g., an ISDN), which inhibits access of a third party, can be adopted. Also, the user may construct a database in addition to the one provided by the vendor and set the database on an external network, and the host management system may authorize access to the database from a plurality of user factories.

Figure 9:
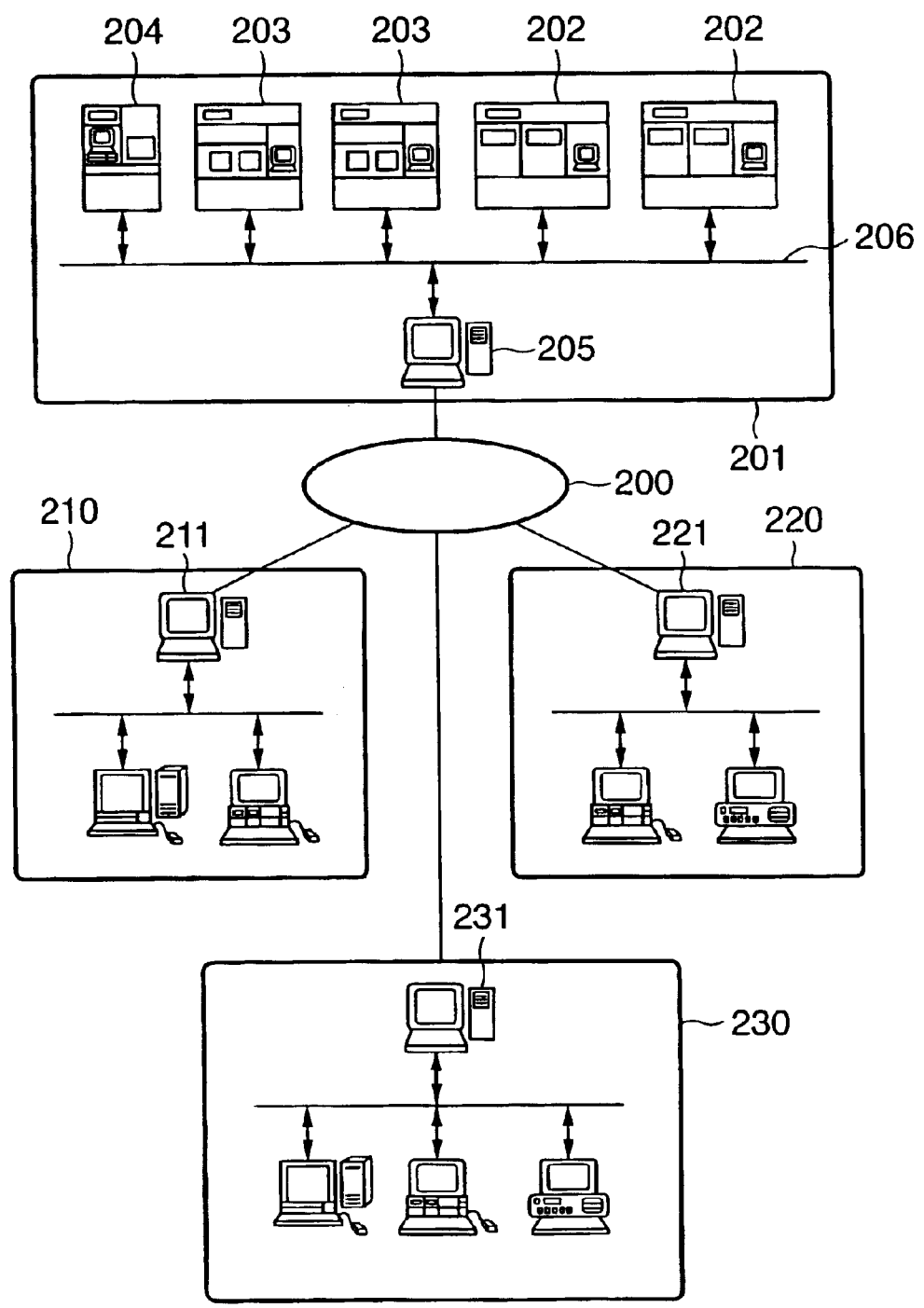
FIG. 9 is a view showing the concept of the semiconductor device production system when viewed from another angle.

FIG. 9 is a view showing the concept of the overall system of this embodiment that is cut out at a different angle from FIG. 8. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 9, a factory having manufacturing apparatuses of a plurality of vendors and the management systems of the vendors for these manufacturing apparatuses are connected via the external network outside the factory, and maintenance information of each manufacturing apparatus is communicated. In FIG. 9, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 9 shows only one manufacturing factory 201, but a plurality of factories are networked in practice. The respective apparatuses in the factory are connected to a LAN 206 to build an intranet, and a host management system 205 manages the operation of the manufacturing line. The business offices of vendors (e.g., apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated network serving as an external network 200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 10 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 10. This allows the operator to access detailed information of each item, to receive the latest-version software to be used for a manufacturing apparatus from a software library provided by a vendor, and to receive an operation guide (help information) as a reference for the operator in the factory. The maintenance information provided by the maintenance database also includes information about the features of the present invention described above. The software library also provides the latest-version software for implementing the features of the present invention.

Figure 11:
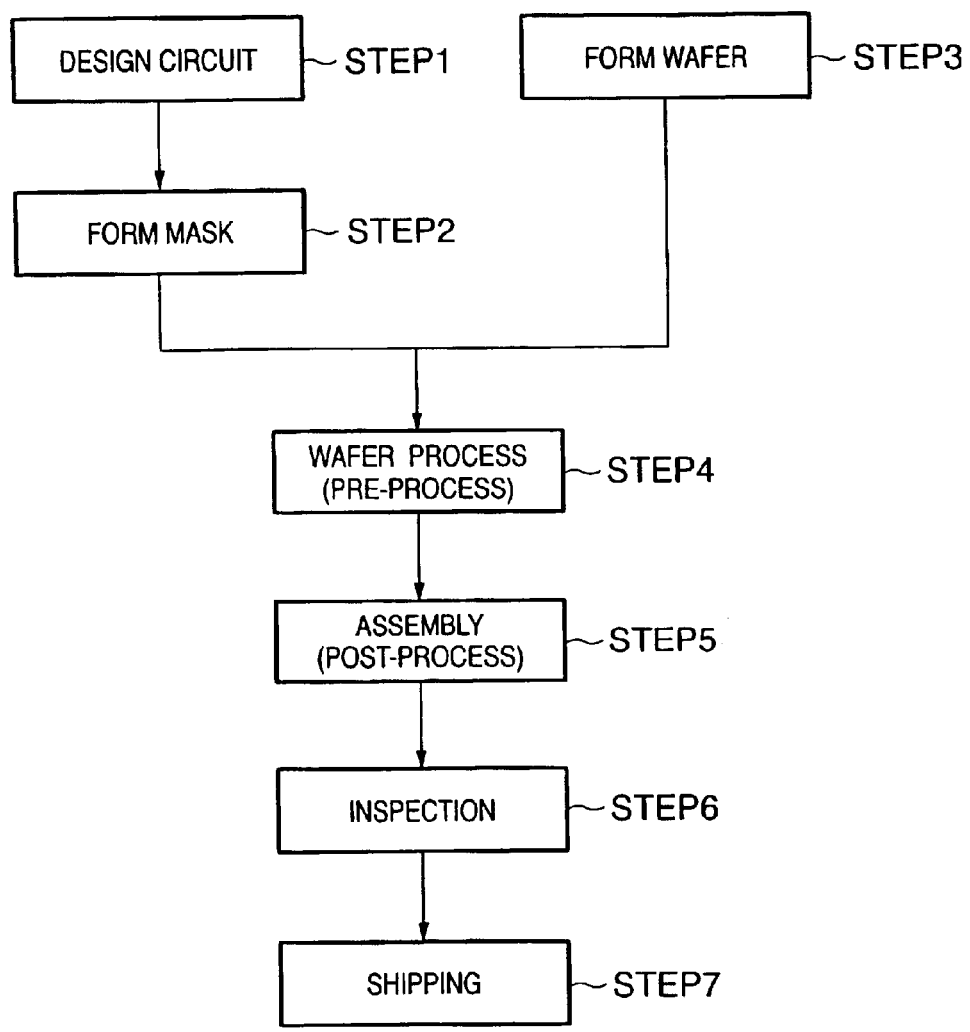
FIG. 11 is a flow chart for explaining the flow of a device manufacturing process.

A semiconductor device manufacturing process using the above-described production system will be explained. FIG. 11 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7). The preprocess and postprocess are performed in separate dedicated factories, and each of the factories receives maintenance by the above-described remote maintenance system. Information for production management and apparatus maintenance is communicated between the pre-process factory and the post-process factory via the Internet or dedicated network.

Figure 12:
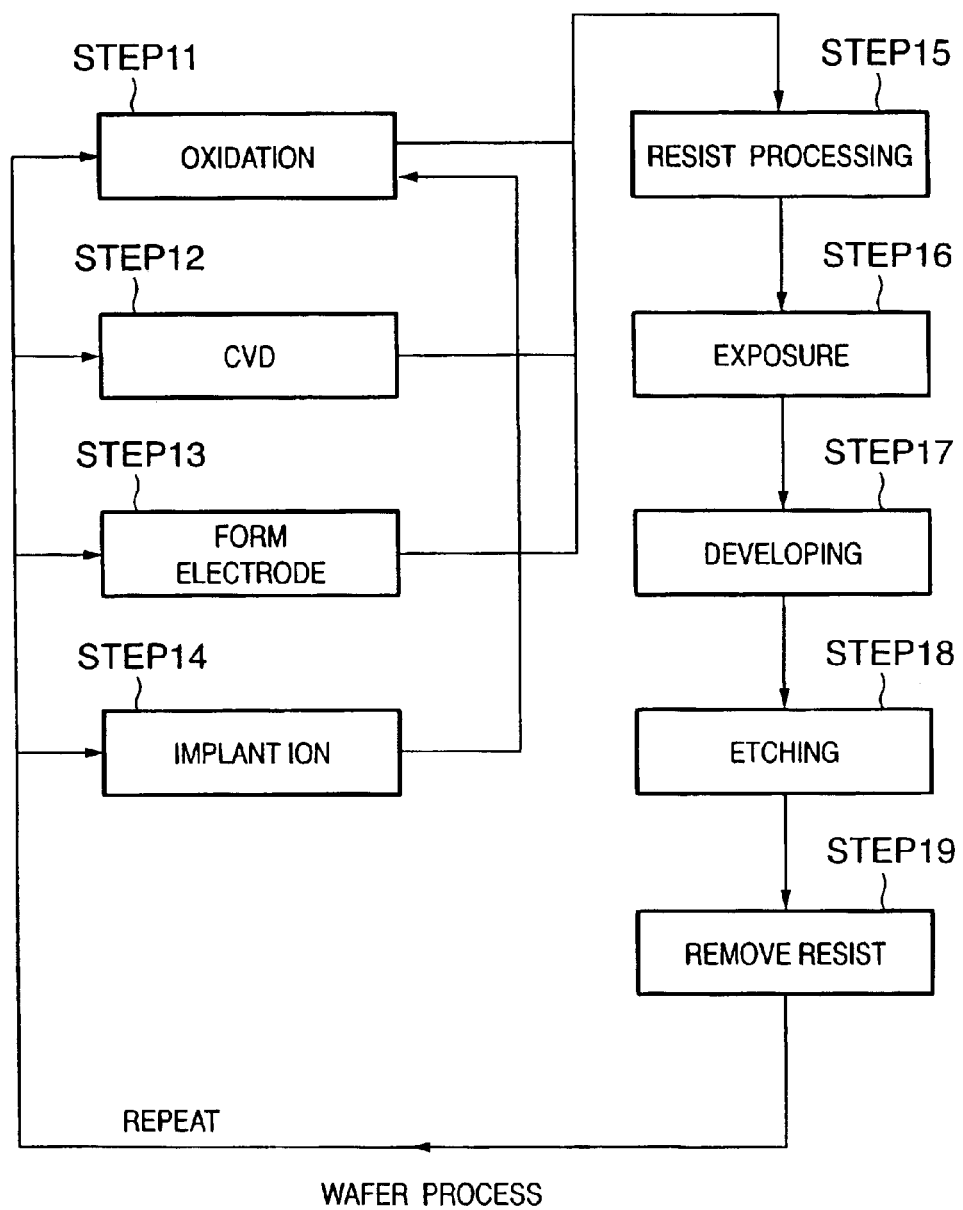
FIG. 12 is a flow chart for explaining a wafer process.

FIG. 12 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask, and prints the circuit pattern on the wafer. In step 17, developing, the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents a trouble in advance. Even if trouble occurs, the manufacturing apparatus can be quickly recovered. The productivity of the semiconductor device can be increased in comparison with the prior art.

In the linear motor and electromagnetic actuator according to the present invention, the first coolant channel near the coil recovers most of the beat generated from the coil. The second coolant channel controls the surface temperature to a predetermined one. The influence of heat on the surroundings can, therefore, be suppressed.

The present invention can suppress fluctuations in the stage space caused by heat generated by the coil. As a result, the alignment precision of the stage in exposure processing, the overlay precision, and the line width precision can be increased. Moreover, the present invention suppresses the influence of heat generated from the coil that increases along with an increase in stage acceleration. This can increase the throughput to realize higher-precision, high-productivity exposure processing than that in the prior art.

As many apparently widely different embodiments of the present invention can be made without departing from the spirit and scope thereof, it is to be understood that the invention is not limited to the specific embodiments thereof except as defined in the claims.

What is claimed is:

1. An electromagnetic actuator having stationary and movable elements, said actuator comprising:
   a magnet arranged on one of said stationary and movable elements;
   a coil arranged on the other one of said stationary and movable elements;
   a first coolant channel formed near said coil; and
   a second coolant channel formed at a portion which is inside and near a surface of at least one of said stationary and movable elements,
   wherein at least a part of said first coolant channel are not coplanar and at least a part of said second coolant channel are formed between said coil and the surface.

2. The actuator according to claim 1, wherein
   the electromagnetic actuator further comprises a support which internally supports said coil, and
   the first coolant channel is formed inside said support.

3. The actuator according to claim 2, wherein
   said stationary element has said coil, and
   said movable element has said magnet.

4. The actuator according to claim 1, further comprising a support which supports said magnet,
   wherein said support is arranged outside said coil and the first coolant channel so as not to contact said coil and the first coolant channel.

5. The actuator according to claim 4, wherein
   said stationary element has said coil, and
   said movable element has said magnet.

6. The actuator according to claim 1, further comprising:
   a temperature detector arranged to detect at least one of a temperature of a coolant flowing through the first coolant channel and a temperature of a coolant flowing through the second coolant channel;
   a thermo-regulator arranged to adjust temperatures of coolants supplied to the first and second coolant channels; and
   a temperature controller arranged to control said thermo-regulator on the basis of a detection result of said temperature detector.

7. The actuator according to claim 1, further comprising a heat insulator arranged outside the second coolant channel or between the first and second coolant channels.

8. The actuator according to claim 1, wherein the first and second coolant channels flow coolants in opposite directions.

9. The actuator according to claim 1, wherein
   a plurality of second coolant channels are formed parallel to each other, and
   flowing directions of coolants through the plurality of second coolant channels are made opposite to each other every predetermined number of channels.

10. The actuator according to claim 1, wherein the second coolant channel is meandered.

11. An electromagnetic actuator having stationary and movable elements, said actuator comprising:
    a magnet arranged on one of said stationary and movable elements;
    a coil arranged on the other one of said stationary and movable elements;
    a first coolant channel formed near said coil; and
    a second coolant channel formed in or near a surface of at least one of said stationary and movable elements,
    wherein at least a part of said first coolant channel and at least a part of said second coolant channel are formed between said coil and the surface or in the surface,
    the first coolant channel is essentially formed to cool said coil, and
    the second coolant channel is essentially formed to adjust a surface temperature of the electromagnetic actuator.

12. The actuator according to claim 11, further comprising:
    a temperature detector arranged to detect a temperature of a surface of the electromagnetic actuator or a temperature near the surface;

a thermo-regulator arranged to adjust temperatures of coolants supplied to the first and second coolant channels; and a temperature controller arranged to control said thermo-regulator on the basis of a detection result of said temperature detector.

13. The actuator according to claim 12, wherein said temperature detector is arranged to detect a temperature of a coolant flowing through the second coolant channel in addition to the temperature of the surface of the electromagnetic actuator or the temperature near the surface.

14. An electromagnetic actuator having stationary and movable elements, said actuator comprising:

a magnet arranged on one of said stationary and movable elements;

a coil arranged on the other one of said stationary and movable elements;

a first coolant channel formed near said coil so as to surround said coil;

a second coolant channel formed in or near a surface of at least one of said stationary and movable elements; and a support which supports said magnet, wherein at least a part of said first coolant channel and at least a part of said second coolant channel are not coplanar and are formed between said coil and the surface or in the surface, and said support is arranged outside said coil and said first coolant channel so as not to contact said coil and said first coolant channel.

15. An electromagnetic actuator comprising:

a movable element having a magnet;

a stationary element having a coil;

a first coolant channel formed near said coil;

a second coolant channel formed in or near a surface of at least one of said stationary and movable elements; and a support which supports said magnet, wherein at least a part of said first coolant channel and at least a part of said second coolant channel are formed between said coil and the surface or in the surface, and said support is arranged outside said coil and said first coolant channel so as not to contact said coil and said first coolant channel, said first coolant channel is formed so as to surround said coil and wherein first and second channels are not coplanar.

16. An exposure apparatus for exposing a substrate with a pattern of a master, said apparatus comprising:

a stage for moving the substrate or master, said stage having a magnet arranged on one of stationary and movable elements, a coil arranged on the other one of the stationary and movable elements, a first coolant channel formed near the coil, and a second coolant channel formed at a portion which is inside and near a surface of at least one of the stationary and movable elements, wherein at least a part of said first coolant channel and at least a part of said second coolant channel are formed between said coil and the surface and wherein first and second channels are not coplanar.

17. The apparatus according to claim 16, wherein the apparatus further comprises a laser interferometer for measuring a position of said stage, and the second coolant channel is formed between an optical axis of said laser interferometer and the coil.

18. A device manufacturing method, comprising the steps of:

installing manufacturing apparatuses, including the exposure apparatus defined in claim 17, for performing various processes, in a device manufacturing factory; and manufacturing a device by performing a plurality of processes using the manufacturing apparatuses.

19. The method according to claim 18, further comprising the steps of:

connecting the manufacturing apparatuses by a local area network; and communicating information about at least one of the manufacturing apparatuses between the local area network and an external network outside the device manufacturing factory.

20. The method according to claim 19, further comprising the step of accessing a database provided by a vendor or user of the exposure apparatus via the external network to obtain maintenance information about at least one of the manufacturing apparatuses by data communication.

21. The method according to claim 19, further comprising the step of performing data communication between the device manufacturing factory and another device manufacturing factory via the external network to perform production management.

22. A device manufacturing factory comprising:

manufacturing apparatuses, including the exposure apparatus defined in claim 16, for performing various processes;

a local area network for connecting said manufacturing apparatuses; and a gateway which enables access from said local area network to an external network outside the factory, wherein information about at least one of said manufacturing apparatuses can be communicated.

23. A maintenance method for the exposure apparatus defined in claim 16, which is installed in a device manufacturing factory, said method comprising the steps of:

causing a vendor or user of the exposure apparatus to provide a maintenance database connected to an external network outside the device manufacturing factory;

permitting access to the maintenance database from the device manufacturing factory via the external network; and transmitting maintenance information accumulated in the maintenance database to the device manufacturing factory via the external network.

24. The apparatus according to claim 19, further comprising:

a display;

a network interface; and a computer for executing network software, wherein maintenance information of the exposure apparatus can be communicated via a computer network.

25. The apparatus according to claim 24, wherein the network software enables connecting said computer to the external network outside the factory where the exposure apparatus is installed, providing on said display a user interface for accessing a maintenance database which is provided by a vendor or user of the exposure apparatus, and obtaining information from the database via the external network.

26. An electromagnetic actuator having stationary and movable elements, said actuator comprising:
a magnet arranged on one of said stationary and movable elements;
a coil arranged on the other one of said stationary and movable elements;
a first coolant channel so as to surround said coil, and
a second coolant channel formed at a portion which is inside and near a surface of at least one of said stationary and movable elements, and wherein first and second channels are not coplanar.

27. The actuator according to claim 26, wherein
said stationary element has said coil, and
said movable element as said magnet.

28. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which is inside and near a surface of at least one of said stationary and movable elements,
wherein at least a part of said first coolant channel is formed between said coil and said second coolant channel, and wherein first and second channels are not coplanar.

29. The actuator according to claim 28, wherein said stationary element has said coil, and said movable element has said magnet.

30. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which is inside and near a surface of at least one of said stationary and movable elements,
wherein at least a part of said first coolant channel and at least a part of said second coolant channel are formed between said coil and the surface, and said first coolant channel is formed between said coil and said second coolant channel.

31. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which is inside and near a surface of at least one of said stationary and movable elements,
wherein at least a part of said first coolant channel and at least a part of said second coolant channel are formed between said coil and the surface, and said second coolant channel is formed between said first coolant channel and the surface.

32. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which is inside and near a surface of at least one of said stationary and movable elements,
wherein at least a part of said first coolant channel and at least a part of said second coolant channel are formed between said coil and the surface, and
said first coolant channel is arranged at a position closer to said coil than said second coolant channel.

33. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which is inside and near a surface of at least one of said stationary and movable elements,
wherein at least a part of said first coolant channel and at least a part of said second coolant channel are formed between said coil and the surface, and
said second coolant channel is arranged at a position closer to the surface than said first coolant channel.

34. An electromagnetic actuator having stationary and movable elements, said actuator comprising:
a magnet arranged on one of said stationary and movable elements;
a coil arranged on the other one of said stationary and movable elements;
a first coolant channel formed near said coil; and
a second coolant channel formed at a portion which inside and near a surface of at least one of said stationary and movable elements,
wherein at least a part of said first coolant channel and at least a part of said second coolant channel are formed between said coil and the surface,
said first coolant channel is essentially formed to cool said coil, and
said second coolant channel is essentially formed to adjust a surface temperature of the electromagnetic actuator.

35. An electromagnetic actuator having stationary and movable elements, said actuator comprising:
a magnet arranged on one of said stationary and movable elements;
a coil arranged on the other one of said stationary and movable elements;
a first coolant channel arranged near said coil so as to surround said coil;
a second coolant channel formed at a portion which is inside and near a surface of at least one of said stationary and movable elements; and
a support which supports said magnet,
wherein at least a part of said first coolant channel and at least a part of said second coolant channel are formed between said coil and the surface, and
said support is arranged outside said coil and said first coolant channel so as not to contact said coil and said first coolant channel, and wherein first and second channels are not coplanar.

36. An electromagnetic actuator comprising:

a movable element having a magnet;

a stationary element having a coil;

a first coolant channel formed near said coil;

a second coolant channel formed at a portion which is inside and near a surface of at least one of said stationary and movable elements; and a support which support said magnet, wherein at least a part of said first coolant channel and at least a part of said second coolant channel are formed between said coil and the surface, said support is arranged outside said coil and said first coolant channel so as not to contact said coil and said first coolant channel, said first coolant channel is so formed as to surround said coil, and wherein first and second channels are not coplanar.

* * * * *